United States Patent [19]
Kushida et al.

[11] Patent Number: 5,148,068
[45] Date of Patent: Sep. 15, 1992

[54] ELECTROMAGNETIC ACTUATOR FOR MOVING AN OBJECT

[75] Inventors: Takeo Kushida, Saitama; Toshiro Higuchi, Kanagawa, both of Japan

[73] Assignee: Zexel Corporation, Tokyo, Japan

[21] Appl. No.: 771,354

[22] Filed: Oct. 4, 1991

[30] Foreign Application Priority Data

Oct. 9, 1990 [JP] Japan .................. 2-271435

[51] Int. Cl.$^5$ ............... H02K 37/00; H02K 7/06
[52] U.S. Cl. .................. 310/46; 310/82; 310/323
[58] Field of Search ............ 310/26, 46, 82, 323

[56] References Cited

U.S. PATENT DOCUMENTS

| | | | |
|---|---|---|---|
| 3,463,953 | 8/1969 | Maxwell | 310/82 |
| 3,794,865 | 2/1974 | Güttinger | 310/82 |
| 4,752,711 | 6/1988 | Tsukimoto et al. | 310/323 |
| 4,837,470 | 6/1989 | Tamura | 310/82 |
| 4,994,698 | 2/1991 | Kliman et al. | 310/81 |

FOREIGN PATENT DOCUMENTS

| | | |
|---|---|---|
| 61-166429 | 12/1985 | Japan . |
| 60-258013 | 7/1986 | Japan . |
| 63-299785 | 12/1988 | Japan . |
| 0186140 | 7/1989 | Japan ............... 310/46 |
| 0060472 | 2/1990 | Japan ............... 310/348 |

Primary Examiner—R. Skudy
Assistant Examiner—C. LaBall
Attorney, Agent, or Firm—Nields & Lemack

[57] ABSTRACT

In an electromagnetic actuator for moving an object, a plurality of electromagnetic circuits is provided to produce a moving magnetic field in a substrate. There is disposed a flexible resilient plate wholly or partially made of a magnetic material. When the electromagnetic circuits impart a magnetic force to the magnetic material to produce a traveling wave in the flexible resilient plate. Also, a magnetic fluid may be disposed on the substrate and the flexible resilient plate be disposed in close contact with the surface of the magnetic fluid.

14 Claims, 7 Drawing Sheets

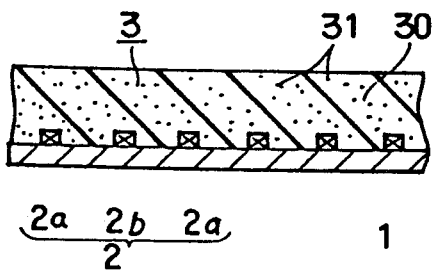
Fig. 4-A
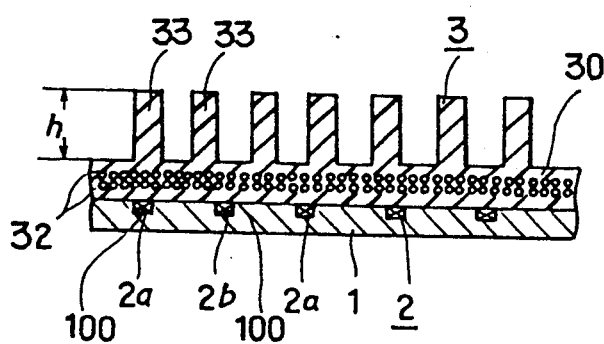
Fig. 4-B
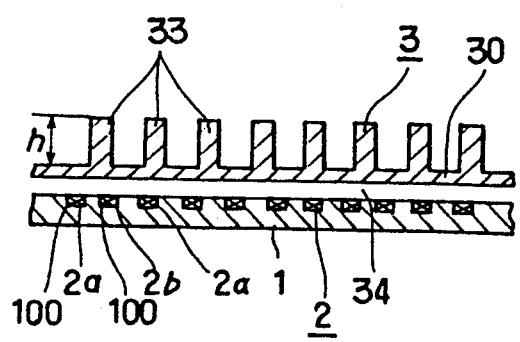
Fig. 4-C
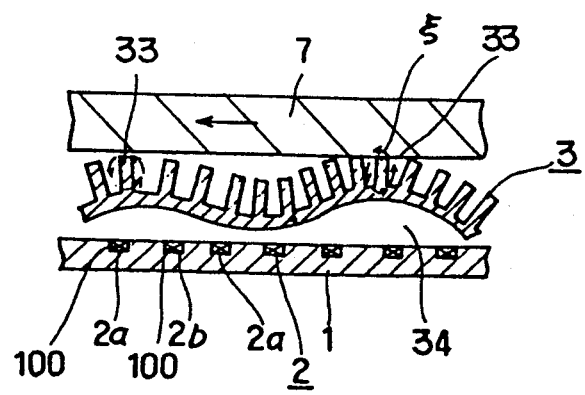
Fig. 5

Fig. 6-A
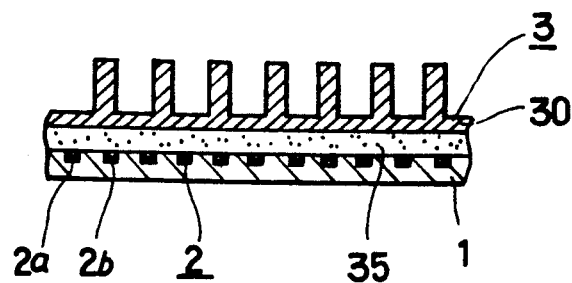
Fig. 6-B
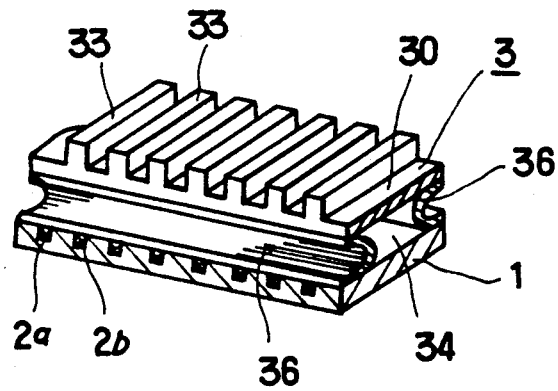
Fig. 6-C
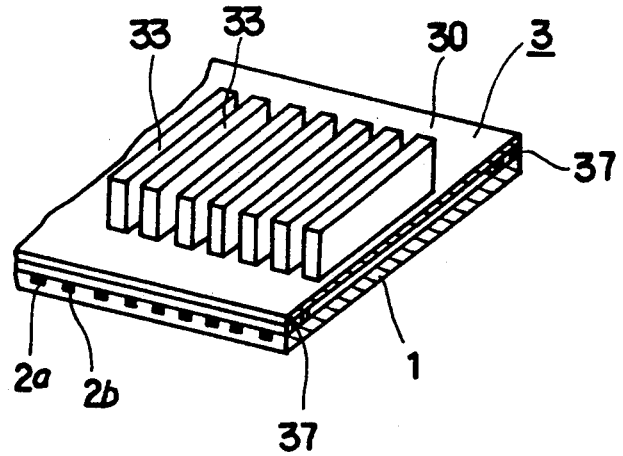

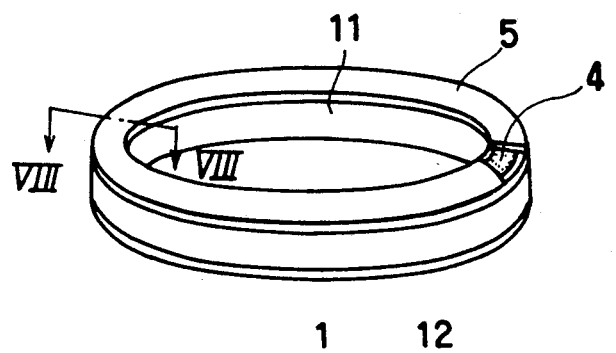
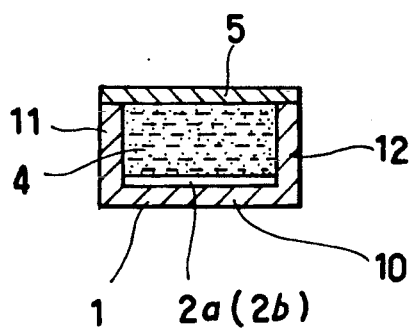
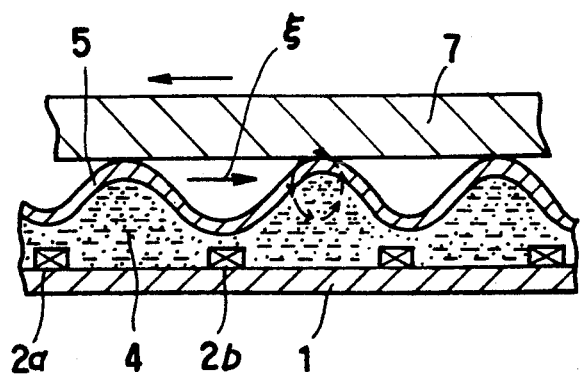

Fig. 10-A
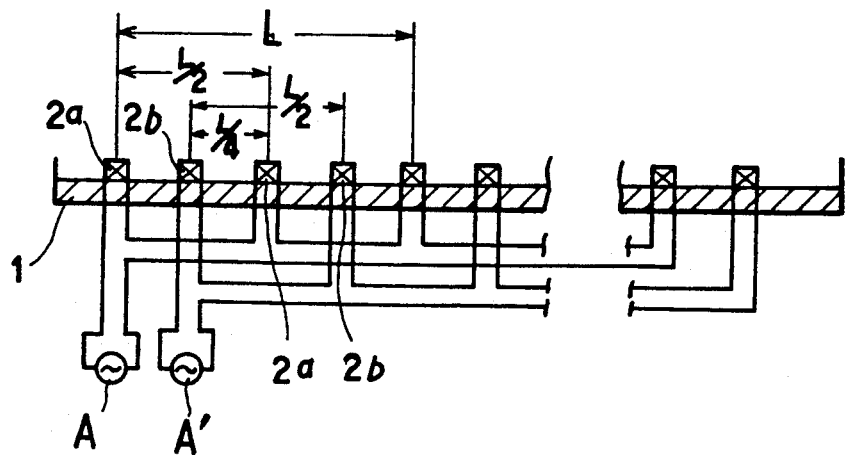
Fig. 10-B
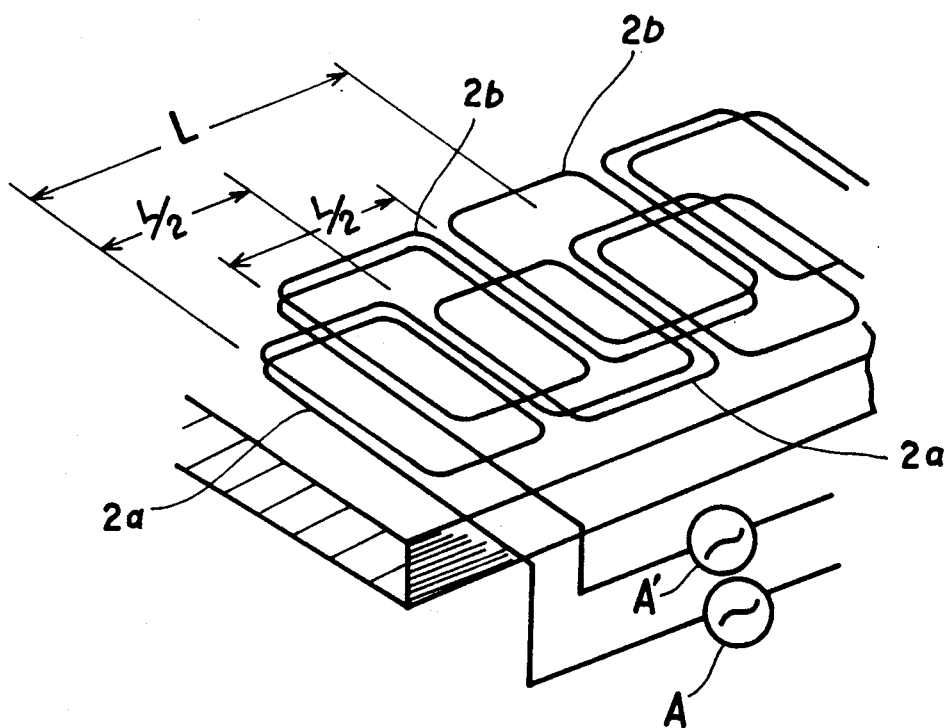
Fig. 11
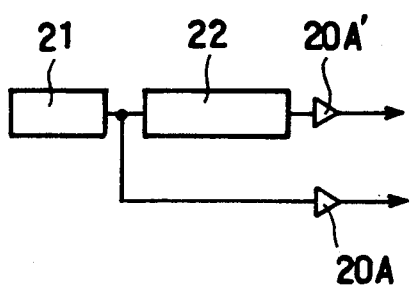

ELECTROMAGNETIC ACTUATOR FOR MOVING AN OBJECT

BACKGROUND OF THE INVENTION

1. Field of the Invention

The present invention relates to an electromagnetic actuator intended for moving an object.

2. Description of the Prior Art

Actuators for moving an object, typically conveyor and the like, are known from the disclosures in the Japanese Patent Application Laid Open Publication Nos. 258013/1985 and 166429/1986.

The actuator of such type has a moving path body made of a material selected among Fe, Cu, Al, etc. under which there is provided a plurality of ultrasound transducers each comprising a piezoelectric element. When a voltage is applied as phase-shifted to these ultrasound transducers, a surface traveling wave is produced in the moving path body to move an object placed thereon.

However, these conventional actuators are disadvantageous in that since they use the piezoelectric elements as electromechanical transducers, the drive voltage must be raised to several thousands volts for application as a high frequency voltage to the piezoelectric elements in order to minimize the displacement and increase the moving speed. Also because the piezoelectric element has a small amplitude of vibration, the moving path body surface of contact with the ultrasound transducers and that with an object to be moved must be shaped with a high precision and machined to a precise surface roughness, and a displacement increasing mechanism is necessary in addition. Further, such actuator generates an audible sound, and because the piezoelectric element used in the actuator is relatively fragile, the actuator cannot easily be assembled or mounted in an equipment.

Also the Japanese Patent Application Laid Open Publication No. 299785/1988 discloses an actuator of translation type. The actuator known from this Publication comprises a moving member, a piezoelectric element fixed to the end of the moving member and an inertia body which is driven by the piezoelectric element to give a shock to the moving member. The expansion or shrinkage of the piezoelectric element impulsively moves the inertia body of which the reaction is utilized to cause the moving member to make an inching motion. However, this actuator also has similar disadvantages to those of the above-mentioned conventional techniques, and so it can only be used as a micro-movement means in positioning and the like.

SUMMARY OF THE INVENTION

The present invention has an object to provide an electromagnetic actuator of a simple structure and which can work with a low frequency and low voltage to move an object at a high speed.

To attain the above object, the actuator according to the present invention comprises a substrate and a plurality of electromagnetic circuits disposed on the substrate and which can produce a moving magnetic field in the substrate. There is disposed on the substrate a flexible resilient plate, as moving path, wholly or partially made of a magnetic material. When the magnetic material is imparted a magnetic force by means of the electromagnetic circuits, a traveling wave is produced in the flexible resilient plate.

More particularly, the flexible resilient plate is itself a magnetic member or has a composite structure having a magnetic material distributed in a matrix formed therein. The matrix is made of a material selected among those having a high anti-frictional resistance and also an excellent abrasion resistance. The magnetic member distributed in the matrix is a powder which is dispersed therein in this case. The magnetic member is in the form of pins or particles. In this case, the magnetic member is buried in the form of a layer in the lower layer area of the matrix.

The above-mentioned electromagnetic circuits are each a coil disposed on the surface of the substrate and which is applied with an AC voltage as phase-shifted at times and positions from an external drive power source. Each of the electromagnetic circuits uses normally two or three sets of coils.

According to the present invention, there is also provided an arrangement in which there is disposed on the substrate a magnetic fluid on the surface of which the flexible resilient plate as moving path is placed in close contact therewith, in place of the above-mentioned arrangement in which the flexible resilient plate is placed directly on the substrate having the plurality of electromagnetic circuits. In this arrangement, the moving magnetic field produced by the electromagnetic circuits imparts to the magnetic fluid a magnetic force which is transmitted to the flexible resilient plate to produce a traveling wave therein.

According to the present invention, a voltage is applied as phase-shifted at both times and positions to the electromagnetic circuits including the coils. Thus, a moving magnetic field takes place in the substrate, the electromagnetic force, large or small, of the magnetic field acts on the magnetic member and a traveling wave of deflection vibration is produced in the flexible resilient plate being in close contact with or integral with the substrate. The point of contact between the neutral face of the traveling wave and an object to be moved delineates an elliptic locus. Since the front of the traveling wave has a component which moves laterally in the opposite direction to the traveling wave itself, the object being in contact with the flexible resilient plate is moved.

Therefore, by appropriately selecting the rigidity of the flexible resilient plate correspondingly to the force given to the object to be move and inducing a traveling wave in a resonant condition, it is possible to obtain a large amplitude of vibration efficiently from a small energy applied. Also, by selecting an appropriate number of turns and diameter of each coil, it is possible to freely set a necessary voltage which is to be applied to the electromagnetic circuits. The actuator according to the present invention can work with a low frequency and low voltage to move an object at a high speed. Also, it has a simple structure, has no moving part and does not require that the surface of contact with the object to be moved and that with the traveling wave should be shaped with a high precision and machined to a precise surface roughness. Further, since it uses no fragile driving elements in it, it can be easily assembled or mounted in an equipment.

Moreover, the actuator according to the present invention is advantageous in that the moving magnetic field can be moved in either of forward and reverse directions so as to move the object not uni-directionally but bi-directionally.

In case the magnetic fluid is used, it is attracted under the electromagnetic force so that the particles forming the magnetic fluid moves in a vibratory manner, this vibratory motion being transmitted to the flexible resilient plate to produce a traveling wave therein. In this case, a vibration amplitude of an elliptic locus corresponding to the thickness of the flexible resilient plate in close contact with the magnetic fluid, thus making it possible to move the object thereon. Because the electromagnetic force and magnetic fluid are used in conjunction, a large amplitude of vibration can be obtained, thereby permitting to further simplify the structure of the actuator.

BRIEF DESCRIPTION OF THE DRAWINGS

FIGS. 4-A to 4-C are partial sectional views showing variants, respectively, of the the flexible resilient plate used in the first embodiment;

FIG. 5 is a partial sectional view showing the flexible resilient plate of FIG. 4-C in operation;

FIGS. 6-A to 6-C are explanatory drawings showing the spacing mechanism in FIG. 4-C;

FIG. 7 is a partially fragmentary perspective view showing a second embodiment of the present invention;

FIG. 8 is a sectional view taken along the line VIII—VIII in FIG. 7;

FIG. 9 is a partial sectional view showing the actuator in operation;

FIG. 10-A is an explanatory drawing showing one example of the electromagnetic circuit used in the present invention;

FIG. 10-B is an explanatory drawing showing the arrangement of the coils;

FIG. 11 is a circuit diagram showing one example of the drive circuit;

DETAILED DESCRIPTION OF THE PREFERRED EMBODIMENTS

Figure 1:
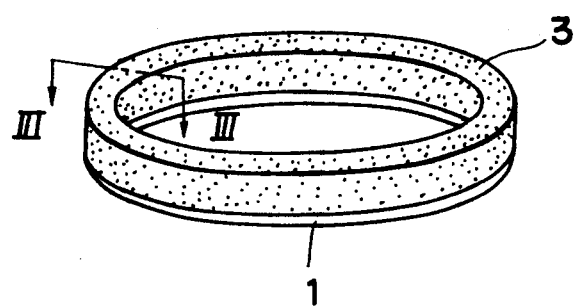
FIG. 1 is a perspective view of a first embodiment of the actuator according to the present invention.
Figure 2:
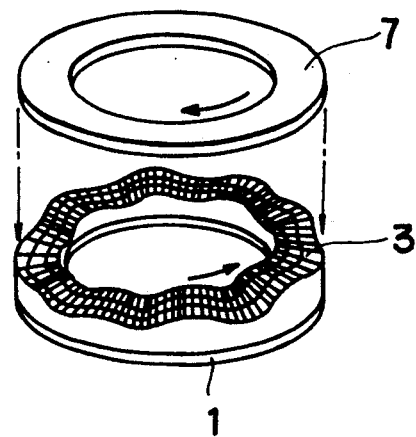
FIG. 2 is a perspective view showing the actuator in operation.
Figure 3:
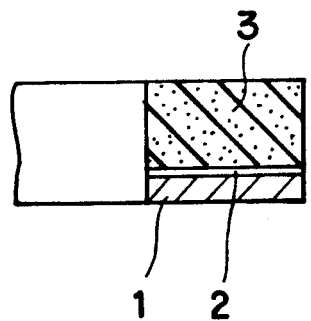
FIG. 3 is a sectional view taken along the line III—III in FIG. 1.

The present invention will be described in further detail with reference to the drawings herebelow.

FIGS. 1 to 6 show the first embodiment of the electromagnetic actuator to which the present invention is applied; FIGS. 7 to 9 show the second embodiment of the electromagnetic actuator according to the present invention; and FIGS. 10 to 13 show the electromagnetic circuit and drive circuit used in the first and second embodiments.

In both the first and second embodiments, the electromagnetic actuator is generally of a circular shape. The reference numeral 1 indicates a substrate made of a rigid magnetic material such as iron plate, which has a ring-like shape in these embodiments.

The reference numeral 2 indicates a plural sets or pairs of coils distributed and fixed over the surface of the substrate 1. The coils are fitted in slots 100 formed in the surface of the substrate 1 as shown in FIGS. 4-B and 4-C, or disposed directly on the surface of the substrate 1 as shown in FIG. 4-A. Normally, two sets (or pairs) or three sets (or pairs) of coils 2 are provided. In the illustration and description made herebelow, two sets of coils will be indicated with reference numerals 2a and 2b, respectively, or three sets of coils will be indicated with reference numerals 2a, 2b and 2c, respectively.

In case the coils 2 are used in two sets, they are disposed with a spacing of L/4 between the successive ones in a pitch of L and also as overlapped by L/4 on each other in a pitch of L/2 as shown in FIGS. 10-A and 10-B. The beginning end and terminating end of each of the coils 2a and 2b are connected to drive power sources A and A', respectively. The drive power sources A and A' comprise each, for example, an oscillator 21 and 90-deg. phase-shifter 22, and power amplifiers 20A and 20A', respectively, as shown in FIG. 11.

Figure 13:
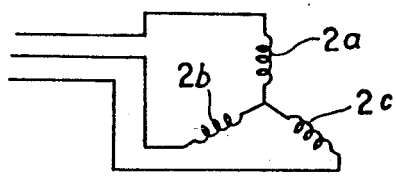
FIG. 13 is a connection diagram of the drive circuit shown in FIG. 12.

The three sets (pairs) of coils 2a, 2b and 2c are conveniently usable when a drive power source used is a commercial power supply of three-phase 200 V AC. In this case, the commercial three-phase RST phase or UVW phase may be used and the coils 2a, 2b and 2c in the three sets (pairs) may be connected, for example, in the star-connection manner as shown in FIG. 13. If this commercial three-phase power source is used, no dedicated drive circuit is needed for the actuator. In this case, the coils in three sets are disposed with a spacing of L/6 between the successive ones and also overlapped by L/6 on each other in a pitch of L/3.

The reference numeral 3 indicates a soft flexible resilient plate provided on the substrate 1 on which the coils 2a and 2b are disposed as mentioned above, this plate forming a moving path. FIGS. 4-A to 4-C show the variants, respectively, of the flexible resilient plate. The flexible resilient plate 3 shown in FIG. 4-A has a composite structure in which as the magnetic member, soft magnetic material powder 31 such as pure iron powder or the like is dispersed in a soft matrix 30. The soft matrix 30 is made of a material selected among the materials having a large coefficient of friction and excellent abrasion resistance such as rubber, plastic and so forth.

FIG. 4-B shows a variant of the flexible resilient plate 3 having a ferromagnetic member 32 as the magnetic member buried in the form of a layer only in the lower layer area of the soft matrix 30 made of a highly frictional and anti-abrasive material such as rubber, plastic or the like. The ferromagnetic member 32 comprise short pins or particles of a material selected among low-carbon steel and the like, and fitted in the matrix 30 so as to be kept a predetermined insulation distance off the surface of the substrate 1.

Preferably, the flexible resilient plate 3 has formed, on the side thereof which is in contact with an object to be moved, protrusions having a predetermined height h, arbitrarily shaped and spaced a predetermined distance from each other, in order to increase the lateral displacement. It should be noted that such protrusions may be adopted in the variant of the plate shown in FIG. 4-A.

FIG. 4-C shows a variant of the flexible resilient plate 3 made of a magnetic material. The magnetic material is selected from the low-carbon steels, typically, S10C and sulfur free-cutting steel. In this case, the flexible resilient plate 3 has integrally formed, similarly to the variant shown in FIG. 4-B, on the body portion 30 (surface) hereof, protrusions having a predetermined height h and spaced a predetermined distance from each other, in order to increase the lateral displacement.

The flexible resilient plate 3 should preferably be kept spaced a predetermined distance 34 from the substrate 1 so as not to be in direct contact with the substrate 1, in order that the plate 3 is resiliently deformed like wave as shown in FIG. 5 when a voltage is applied to the coils 2a and 2b.

FIGS. 6-A to 6-C show variants of the above-mentioned spacing structure. FIG. 6-A shows a such spacing structure which is an expanded rubber 35 like sponge (this material being just an example) provided between the body portion 30 of the flexible resilient plate 3 and the substrate 1. FIG. 6-B shows another variant using spring members 36 made of an insulative material which support both the lower sides of the body portion 30 of the flexible resilient plate 3. The spring members 36 have an easily flexible shape such as lateral U recess, of which the one side is fixed to the substrate 1 while the other side is connected to the bottom of the body portion 30. Needless to say, the spring members 36 may be formed integrally, as legs, with the body portion 30. In the variant shown in FIG. 6-C, the body portion 30 itself is a leaf-spring member having formed thereon protrusions 33 shorter in length than the width of the body portion 30 of which both the lower sides are supported on the substrate 1 by means of spacers 37.

It should be noted that although the matrix 30 is in direct contact with the substrate 1 as shown in FIGS. 4-A and 4-B, the present invention is not limited to this arrangement but any of the spacing structures shown in FIGS. 6-A to 6-C may be utilized for this purpose.

According to the second embodiment shown in FIGS. 7 to 9, the substrate 1 has provided on the inner and outer circumferences thereof side walls 11 and 12 made of a nonmagnetic material. Thus the section of the substrate 1 has the generally form of a recess. An area defined by a bottom wall 10 and side walls 11 and 12 is filled with a magnetic fluid 4. The magnetic fluid 4 is a stable colloidal solution containing fine ferromagnetic particles dispersed in a nonmagnetic base solution. The nonmagnetic base solution is appropriately selected from oil, water, mercury, toluene, etc. The fine ferromagnetic particles are appropriately selected among iron oxide, cobalt, Fe coated with SN, Fe coated with Na, etc.

A flexible resilient plate 5 is in close contact with the magnetic fluid 4. The flexible resilient plate 5 is made of a material having a high coefficient of friction and abrasion resistance such as rubber, plastic or the like. This plate 5 is fixed as bonded or otherwise at both edges thereof to the side walls 11 and 12 of the substrate 1.

The reference numeral 7 indicates an object to be moved. The object is to be placed on the flexible resilient plate 3 or 5.

By designing the actuator to a circular form when viewed in plan view as in the aforementioned embodiment, it can be lightweight. Also since a traveling wave having a plurality of peaks moving circumferentially as the time passes can be produced, the object 7 can be moved fast. However, the present invention is not limited to a moving path having a linear (planar) surface. The moving path may be cylindrical or spherical.

Figure 16:
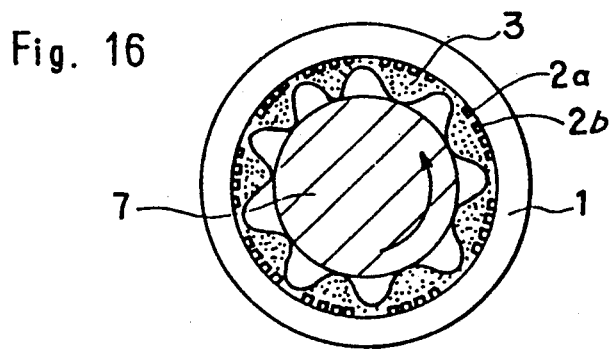
FIG. 16 is a plan view showing an application of the present invention to a cylindrical actuator.

FIG. 16 shows a cylindrical actuator. In this embodiment, the substrate 1 has a cylindrical shape (whether long or short) and has disposed on the inner cylindrical wall thereof a plurality of coils 2a and 2b having been described in the foregoing. Further, the flexible resilient plate 3 shown in any of FIGS. 4-A to 4-C is disposed inside the coils. In this structure, the flexible resilient plate 3 has an annular form, and when inserted in this ring, the object 7 can be rotated in the direction of arrow.

Figure 19:
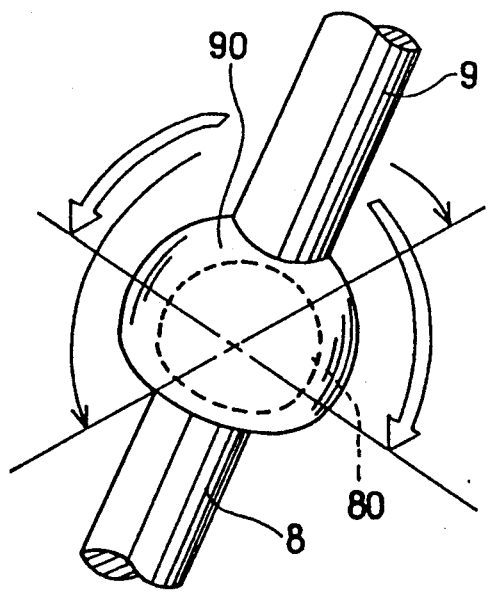
FIG. 19 is a perspective view showing an application of the present invention to a universal joint.
Figure 20:
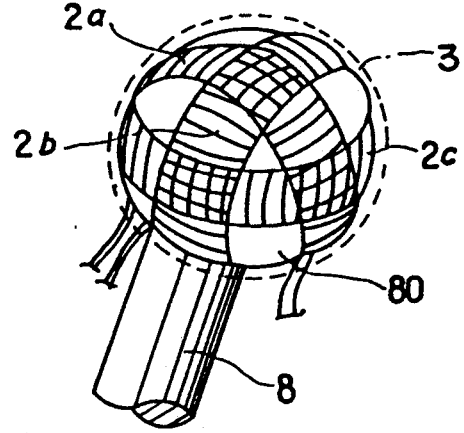
FIG. 20 is a perspective view showing an example arrangement of coils in the application shown in FIG. 19.

FIGS. 19 and 20 show applications, respectively, of the present invention to a shaft joint. As seen, a plurality of coils 2a, 2b and 2c are disposed perpendicularly to each other on the outer circumference of a ball 80 (corresponding to the substrate 1 in the aforementioned embodiment) at the end of a drive shaft 8. As an outer layer, a flexible resilient plate 3 as shown in FIG. 4-A is provided only on the coils or on the entire circumference of the ball 80 including the coils. FIG. 20 shows an imaginary view of the flexible resilient plate 3. A spheric seat 90 of a shaft to be moved is fitted over the flexible resilient plate 3. With this actuator, the shaft 9 can be rotated about the axis of the drive shaft 8 and also about the X-axis and Y-axis perpendicular to the X-axis.

Furthermore, the actuator according to the present invention can be constructed in the form of an endless elliptic loop similar to a belt conveyor. Also if the actuator is made like a linear belt and vibration is attenuated at both ends thereof, an object can be moved in a translation manner.

Figure 17:
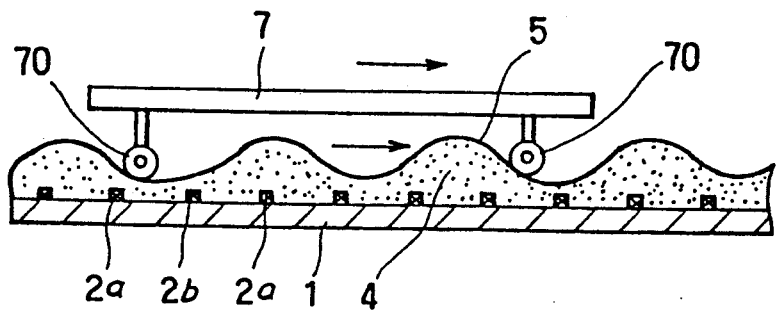
FIGS. 17 and 18 are explanatory drawings showing another method of moving an object according to the present invention.
Figure 18:
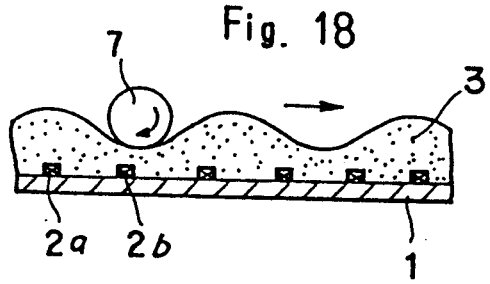

Also, if an object to be moved 7 is provided with rollers 70 as shown in FIG. 17, it can be moved in the direction of the traveling wave. Moreover, an object can be moved as rotated due to the friction of the flexible resilient plate 3 as shown in FIG. 18.

The actuator according to the present invention functions as will be described herebelow:

For movement of the object 7 by the actuator operated on a two-phase drive power source, an AC voltage is applied to every two neighboring coils 2a and 2b as phase-shifted by $\pi/2$ (90°) at times and positions by means of a phase-shifter 22.

Assume that the moving direction of the traveling wave is x, time is t, angular velocity is $\omega$ and wavelength of the magnetic field is l. Then, the coil 2a is applied with an AC voltage of $A \cos \omega t \cdot \cos(2\pi/l \cdot x)$ while the coil 2b is with an AC voltage of $A \cos(\omega t - \pi/2) \cdot \cos(2\pi/l \cdot x - \pi/2)$.

Figure 14:
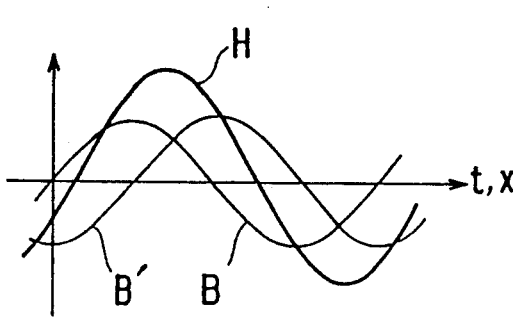
FIG. 14 shows the waveform of the moving magnetic field in the present invention.
Figure 15:
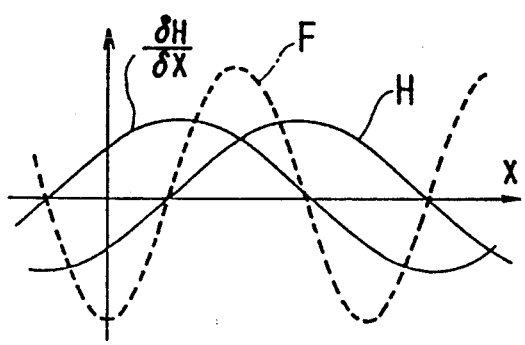
FIG. 15 shows the waveform of the electromagnetic force in the present invention.
Figure 12:
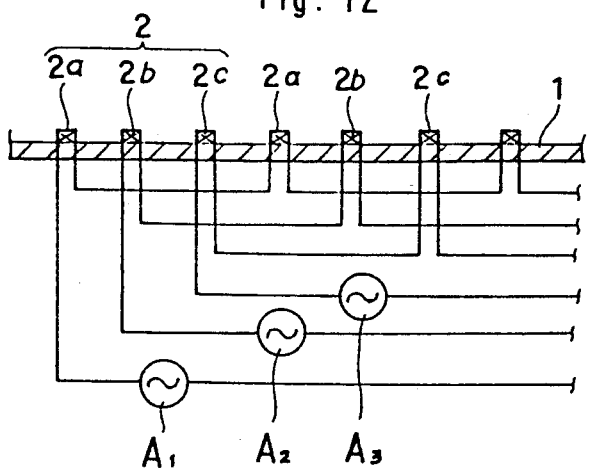
FIG. 12 is an explanatory drawing showing another example of the drive circuit.

Thus, a sinusoidal wave B due to the coil 2a and sinusoidal wave B' due to the coil 2b cause a moving magnetic field H to develop between the peaks of the waves B and B', respectively, as shown in FIG. 14. This moving magnetic field H is expressed as follows:

$$H = H_0 A \cos(\omega t - 2\pi/l \cdot x - \Phi)$$

where
$H_0 = 1/\sqrt{R^2 + (WL)^2} \cdot n$
R: Coil resistance
L: Coil inductance n: Turns of coil
$\sqrt{R^2+(WL)^2}$: Coil impedance
Φ: Phase difference caused by the coil inductance As the result, the moving magnetic field delineates two kinds of sin curve H and δH/δx as shown in FIG. 15, the combination of these curves yields an electromagnetic force F ($=F_x \propto H \cdot \delta H/\delta x$) which is traveling.

$$H = H_0 A\cos(\omega t - 2\pi/l \cdot x - \Phi)\delta H/\delta x$$
$$= H_0 A \cdot 2\pi/l \sin(\omega t - 2\pi/l \cdot x - \Phi)$$

Therefore, $H \cdot \delta H/\delta x = 2\pi/l \cdot H_0^2 A^2 \cdot 1/2 \sin(2\omega t - 4\pi/l \cdot x - 2\Phi)$ The ($2\omega t - 4\pi/l \cdot x - 2\Phi$) in the equation indicates the form of the traveling wave, and the moving speed can be freely adjusted by changing the frequency of the power source.

According to the second embodiment of the present invention, a magnetic fluid 4 is filled on the coils 2a and 2b. Therefore, the magnetic fluid 4 is attracted at a location where the electromagnetic force F occurred and correspondingly to the strength of the electromagnetic force. Since the magnetic fluid 4 is surrounded at the bottom and lateral sides thereof by rigid members, it vibrates only in the direction of height, thereby producing a traveling wave ξ which moves in the direction of arrow as the time passes as shown in FIG. 9. As it is in close contact with the magnetic fluid 4, the flexible resilient plate 3 acts similarly to the magnetic fluid 4. In this embodiment, the vibration is not transmitted to any rigid member but the magnetic fluid 4 is used to produce a vibration due to the assembling and scattering of the fine particles. Thus, a large amplitude of vibration can be obtained effectively and efficiently.

The front of the traveling wave ξ, namely, a certain particle on the surface in contact with the object to be moved 7, travels delineating an elliptic locus of movement based on the ratio between the longitudinal and lateral displacements. The front of the traveling wave ξ (maximum point of the longitudinal displacement) has a nature to move laterally in the opposite direction to the traveling wave. Therefore, an object to be moved 7 having a larger dimensions than the wavelength of deflection vibration is in contact with the wave front alone and can be moved due to the friction of the flexible resilient plate 5 in the direction of arrow in FIG. 9.

In the first embodiment of the present invention, a sound wave (traveling wave ξ) is produced in the flexible resilient plate 3 due to the electromagnetic force shown in FIG. 14. As the front of the sound wave travels continuously while the particle on the surface is moving along the elliptic locus, the object 7 can be moved. The first embodiment is advantageous as compared with the second embodiment in that the amplitude of vibration can be freely changed because of the Young's modulus of the flexible resilient plate 3 and in that the actuator can be designed to has a simple structure.

In the actuator using the variant of flexible resilient plate shown in FIG. 4-A, because the magnetic material powder 31 dispersed in the matrix 30 is magnetically attracted, a traveling sound wave is produced in the flexible resilient plate 3. In the actuator having the variant shown in FIG. 4-B, when the ferromagnetic member 32 is magnetized and attracted, a sound wave is produced in the flexible material but the object can be moved at a higher speed because the lateral displacement is increased due to the protrusions 33. In the actuator using the flexible resilient plate shown in FIG. 4-C, the plate 3 itself is resiliently deformed like wave under the effect of magnetism as shown in FIG. 5 so that the object 7 is effectively moved while being in contact with the ends of the protrusions 33 (wave front).

For operation of the actuator on a commercial drive power source of three-phase 200 V, the electromagnetic circuit is constructed as shown in FIG. 13, and a sinusoidal wave expressed as in the following is applied as phase-shifted by 120° ($\frac{2}{3}\pi$) at times and positions:

$A_1 = A_0 \cos t \cos(2\pi/l \cdot x)$
$A_2 = A_0 \cos(\omega t - \frac{2}{3} \cdot \pi)\cos(2\pi/l \cdot x - \frac{2}{3} \cdot \pi)$
$A_3 = A_0 \cos(\omega t - 4/3 \cdot \pi)\cos(2\pi/l \cdot x - 4/3 \cdot \pi)$ In case such commercial power source is used for moving an object by the actuator according to the present invention, the moving speed cannot be changed by changing the frequency of the power source which is fixed, but when it is necessary to change the speed, it suffices to change the amplitude of the voltage applied.

Also, according to the present invention, it is possible to move the moving magnetic field in reverse direction as well as in forward direction. This changing of moving direction can be effected in the case of, for example, two-phase power source being used for operation of the actuator, by shifting the time phase of the coils 2a and 2b from delay of 90° to advance of 90°.

More particularly, the voltage of 90° delay applied to the coils 2a and 2b is as follows:

$$A\cos t \cdot \cos(2\pi/l \cdot x) + A\cos(\omega t - \pi/2)\cdot \cos(2\pi/l \cdot x - \pi/2)$$

Therefore, $$A\cos(\omega t - 2\pi/l \cdot x) \quad (1)$$

The point of $\omega t - 2\pi/l \cdot x = 0$ in this equation (1), namely, the peak point of the cos curve shown in FIG. 14, will move in the positive direction because of $x = l/2\pi \cdot \omega t$ and time lapses.

On the contrary, when the coils are applied with a voltage of 90° advance, the following results:

$$A\cos(\omega t + 2\pi/l \cdot x) \quad (2)$$

The peak point above $\omega t + 2\pi/l \cdot x = 0$ in this equation (2) will move in the negative direction because of $x = -l/2\pi \cdot \omega t$ and time lapse.

What is claimed is:

1. An actuator for moving an object, comprising:
   a rigid substrate (1) made of a magnetic material;
   a plurality of coils (2) disposed on the surface of said substrate (1);
   drive power sources (A, A') connected to said plurality of coils (2) and which apply an AC voltage as phased-shifted at times and positions to said plurality of coils (2), thereby producing a moving magnetic field; and
   a flexible resilient plate (3) disposed as moving path on said substrate (1), wholly or partially made of a magnetic material;
   the magnetic force imparted to the magnetic material of said flexible resilient plate (3) from said moving magnetic field of said plurality of coils (2) producing a traveling wave in said flexible resilient plate (3).

2. An actuator according to claim 1, wherein said coils (2) are in two or three sets, of which the coils (2a, 2b) or (2a, 2b, 2c) are disposed on said substrate (1) as spaced a ¼ pitch between two successive ones and overlapped a ¼ pitch on each other in a ½ pitch.

3. An actuator according to claim 1, wherein said flexible resilient plate (3) has a composite structure in which a magnetic material powder (31) is dispersed in a soft matrix (30) having a high coefficient of friction and abrasion resistance.

4. An actuator according to claim 1, wherein said flexible resilient plate (3) has pin- or particle-shaped ferromagnetic members (32) buried in the lower layer area of a soft matrix (30) having a high coefficient of friction and abrasion resistance and also has displacement increasing protrusions (33) formed as spaced a predetermined distance from each other on the side thereof being in contact with an object to move.

5. An actuator according to claim 1, wherein said flexible resilient plate (3) is made of a magnetic material and has displacement increasing protrusions (33) formed as spaced a predetermined distance from each other on the side thereof being in contact with an object to move.

6. An actuator according to any one of claims 3, 4 or 5, wherein said flexible resilient plate (3) is kept an insulation distance (34) from said substrate (1) with the aid of spacing means.

7. An actuator according to claim 6, wherein said spacing means is a expanded material (35) like a sponge.

8. An actuator according to claim 6, wherein said spacing means comprises spring members (36).

9. An actuator according to claim 6, wherein said flexible resilient plate (3) has a leaf spring of which both sides are supported to said substrate (1) by means of spaces (37).

10. An actuator for moving an object, comprising:
a rigid substrate (1) made of a magnetic material;
a plurality of coils (2) disposed on the surface of said substrate (1);
drive power sources (A, A') connected to said plurality of coils (2) and which apply an AC voltage as phased-shifted at times and positions to said plurality of coils (2), thereby producing a moving magnetic field; and
a magnetic fluid (4) disposed on said substrate (1); and
a flexible resilient plate (5), as moving path, being in close contact with the surface of said magnetic fluid (4);
the magnetic force imparted to said magnetic fluid from said moving magnetic field of said plurality of coils (2) producing a traveling wave in said flexible resilient plate (5).

11. An actuator according to claim 10, wherein said substrate (1) has side walls (11, 12), said magnetic fluid 4 being filled in an area surrounded by said side wall (11) and said flexible resilient plate (5) being fixed at the edge thereof to said side walls (11, 12).

12. An actuator according to claim 1 or 10, wherein it is circular as viewed from above, the moving path being flat.

13. An actuator according to claim 1 or 10, wherein it is cylindrical or spherical, the moving path being curved.

14. An actuator according to claim 1 or 10, wherein it is in the form of a linear belt.

* * * * *